(12) United States Patent
Suzuki et al.

(10) Patent No.: US 11,360,122 B2
(45) Date of Patent: Jun. 14, 2022

(54) CURRENT SENSOR AND METHOD FOR MANUFACTURING CURRENT SENSOR

(71) Applicant: Asahi Kasei Microdevices Corporation, Tokyo (JP)

(72) Inventors: Kenji Suzuki, Tokyo (JP); Kenji Kai, Tokyo (JP)

(73) Assignee: Asahi Kasei Microdevices Corporation, Tokyo (JP)

(*) Notice: Subject to any disclaimer, the term of this patent is extended or adjusted under 35 U.S.C. 154(b) by 0 days.

(21) Appl. No.: 16/916,178

(22) Filed: Jun. 30, 2020

(65) Prior Publication Data
US 2021/0011058 A1 Jan. 14, 2021

(30) Foreign Application Priority Data

Jul. 10, 2019 (JP) .............................. JP2019-128714
May 12, 2020 (JP) .............................. JP2020-084150

(51) Int. Cl.
*G01R 15/20* (2006.01)
*H01L 43/14* (2006.01)
*H01L 43/06* (2006.01)
*G01R 19/00* (2006.01)

(52) U.S. Cl.
CPC ....... *G01R 15/202* (2013.01); *G01R 19/0092* (2013.01); *H01L 43/065* (2013.01); *H01L 43/14* (2013.01)

(58) Field of Classification Search
CPC ... H01L 43/065; H01L 43/14; G01R 19/0092; G01R 15/207
See application file for complete search history.

(56) References Cited

U.S. PATENT DOCUMENTS

| 9,958,482 | B1* | 5/2018 | Latham | G01R 15/205 |
| 10,215,781 | B2 | 2/2019 | Suzuki | |
| 2011/0221429 | A1* | 9/2011 | Tamura | G01R 15/207 324/244 |
| 2012/0081110 | A1* | 4/2012 | Racz | G01R 15/202 324/252 |
| 2016/0187388 | A1* | 6/2016 | Suzuki | G01R 19/0092 324/244 |
| 2016/0223594 | A1* | 8/2016 | Suzuki | G01R 15/20 |
| 2016/0313375 | A1 | 10/2016 | Etschmaier | |
| 2018/0156845 | A1* | 6/2018 | Suzuki | G01R 15/207 |
| 2018/0306842 | A1 | 10/2018 | Fukunaka | |
| 2018/0337115 | A1* | 11/2018 | Cho | H01L 25/18 |
| 2019/0204363 | A1 | 7/2019 | Suzuki | |

FOREIGN PATENT DOCUMENTS

| JP | 2016223808 A | 12/2016 |
| JP | 2017134022 A | 8/2017 |

\* cited by examiner

*Primary Examiner* — Dominic E Hawkins

(57) ABSTRACT

Provided is a current sensor for reducing heat generation caused by energization. The current sensor is provided, including: primary terminals; a first magnetic sensor; a primary conductor; and a signal processing IC; wherein the primary conductor has a bend section including: a first region that surrounds at least a part of the first magnetic sensor in planar view and at least a part of which does not face the signal processing IC; and a second region that faces the signal processing IC; wherein the height of the first region is lower than that of the primary terminal, the height of the second region is lower than that of the first region, and the first magnetic sensor is connected to the signal processing IC through conductive wires, on the opposite side from the plane.

19 Claims, 10 Drawing Sheets

CURRENT SENSOR AND METHOD FOR MANUFACTURING CURRENT SENSOR

The contents of the following Japanese patent application(s) are incorporated herein by reference:
No. 2019-128714 filed in JP on Jul. 10, 2019, and
No. 2020-084150 filed in JP on May 12, 2020.

BACKGROUND

1. Technical Field

The present invention relates to a current sensor and a method for manufacturing the current sensor.

2. Related Art

Conventionally, for a current sensor, a current sensor for detecting a to-be-measured current by using a magnetic sensor for outputting a signal in response to a magnetic field generated by the to-be-measured current has been known. For example, Patent Literature 1 and Patent Literature 2 disclose a current sensor having: a terminal for inputting and outputting the to-be-measured current; and a conductor that is connected to the terminal, through which the to-be-measured current flows; and a magnetic sensor that is arranged in proximity to the conductor.
[Patent Literature 1] Japanese Unexamined Patent Application Publication No. 2015-045634.
[Patent Literature 2] Japanese Unexamined Patent Application Publication No. 2018-179994.

SUMMARY

For example, in the Patent Literature 2, a conductor through which a current flows is thinned except for a terminal portion that is exposed to a package surface of a current sensor, and is contained inside the package. As a result, the conductor has high resistance. This causes heat generation occurred from the conductor when a high-current flows through the current sensor to be large, resulting in a problem in current detection accuracy.

To solve the problem, in a first aspect of the present invention, a current sensor is provided, wherein the current sensor includes: a primary terminal; a first magnetic sensor; a primary conductor that is arranged on the same plane as the primary terminal and that is connected to the primary terminal; a signal processing IC that is arranged on the opposite side from the first magnetic sensor relative to the primary conductor, away from the first magnetic sensor, in planar view; and a wire for connecting the first magnetic sensor and the signal processing IC, stepping over the primary conductor, the primary conductor having a first region that does not face the wire and a second region that faces the wire, the height of the second region being lower than that of the first region.

The current sensor includes a plurality of wires, and the height of the second region that faces one of the plurality of wires and the height of the second region that faces the other wires may be lower than that of the first region. The first magnetic sensor, the signal processing IC, the primary wires, a part of the primary terminals, and the primary conductor may be sealed in a package.

The first magnetic sensor and the signal processing IC may not be exposed to the outside of the package.

The primary conductor may not be exposed to the outside of the package.

The first magnetic sensor may be a Hall element.

The Hall element may be a compound semiconductor chip. The signal processing IC may be a silicon chip.

The package may have a leadless structure with no lead protruding from a resin molding.

A height difference between the primary terminal and the first region may be smaller than a height difference between the first region and the second region.

The height difference between primary terminal and the first region may be 20 μm or more and may be 40% or less of the height of the primary terminal.

The current sensor further includes a secondary terminal that is connected to the signal processing IC via a secondary wire and that is arranged on a plane, wherein the secondary terminal may include a third region whose height is higher than the height of the signal processing IC.

A fourth region, in the secondary terminal, to which the secondary wire is connected is lower than the third region, wherein the height difference between the third region and the fourth region may be substantially the same as a sum of the height difference between the first region and the second region and the height difference between the primary terminal and the first region.

The signal processing IC may be arranged between the primary conductor and the secondary terminal, in planar view.

The primary conductor may be configured to flow a to-be-measured current between a first primary terminal and a second primary terminal that are arranged along a first edge of the current sensor. The first magnetic sensor may be arranged at a location surrounded by the primary conductor, in planar view.

The current sensor may include a second magnetic sensor that is arranged outside of a region surrounded by the primary conductor and the first edge, in planar view.

The signal processing IC may be supported only by a resin.

In a second aspect of the present invention, a method for manufacturing a current sensor is provided. The method for manufacturing the current sensor may include: forming, on a plane of the primary conductor, a height difference between a first region and a second region by etching, and forming a height difference between the primary terminal and the first region by etching or coining.

The summary clause does not necessarily describe all necessary features of the embodiments of the present invention. Further, the present invention may also be a sub-combination of the features described above.

DESCRIPTION OF EXEMPLARY EMBODIMENTS

The following describes the present invention through embodiments of the invention, but the following embodiments do not limit the scope of the invention according to the claims. In addition, not all the combinations of features described in the embodiments are necessarily required in solutions of the invention.

Figure 1:
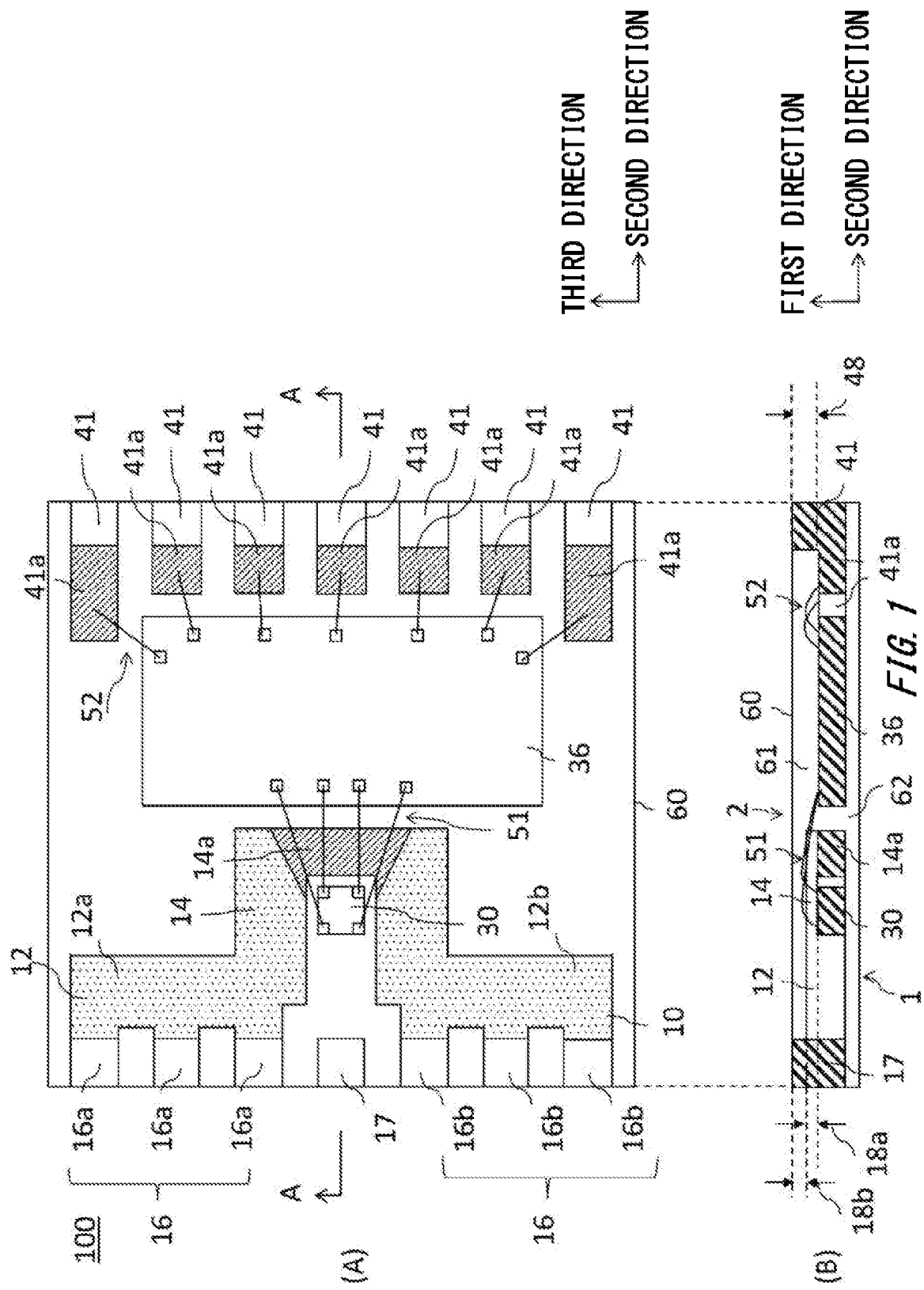
FIG. 1 illustrates a plan view and a schematic sectional view of an internal structure of a current sensor according to this embodiment.

FIG. 1 illustrates structures of a current sensor 100 according to this embodiment. A part (A) in FIG. 1 illustrates a plan view of an internal structure of the current sensor 100. A part (B) in FIG. 1 illustrates a schematic sectional view of the current sensor 100, along a line A-A in the part (A). The current sensor 100 detects a to-be-measured current by using a signal outputted from a magnetic sensor in response to a magnetic field generated by the to-be-measured current flowing through a conductor. Note that in schematic sectional views including FIG. 1, cutting planes are indicated with hatched lines. Note that, as shown in FIG. 1, a bottom plane of the current sensor 100 is referred to as a first plane 1, and the plane (top plane) opposite to the first plane 1 is referred to as a second plane 2. In addition, a direction perpendicular to the first plane 1, a direction orthogonal to the first direction, and a direction orthogonal to the first direction and the second direction, are referred to as a first direction, second direction, and a third direction, respectively. Further, one edge of edges facing each other in the second direction of the first plane 1 of the current sensor 100 is referred to as a first edge. Note that the above terms such as "top plane" and "bottom plane" are conveniently named on the basis of the condition shown in FIG. 1, and the terms do not indicate an implementation condition of the current sensor 100 relative to a substrate or the like. The current sensor 100 in the figure is implemented on the substrate such that the second plane 2 faces the substrate side. Thus the second plane 2 is a bottom plane and the first plane 1 is a top plane, provided that the substrate side is a "bottom plane".

The plan view and the sectional view in the figure represent an internal constitution of the current sensor 100, with a package 60 (a first sealing member 61 and a second sealing member 62) viewed transparently. The current sensor 100 includes a plurality of primary terminals 16, a primary dummy terminal 17, a primary conductor 10, a first magnetic sensor 30, primary wires 51, a signal processing integrated circuit (IC) 36, secondary terminals 41, secondary wires 52, and a package 60.

The plurality of primary terminals 16 is connected to the primary conductor 10, and are conductive terminals for flowing a to-be-measured current between an outside (not shown) and the primary conductor 10. In this embodiment, the plurality of primary terminals 16 is arranged spaced apart each other in the third direction, along the first edge of the current sensor 100. The plurality of primary terminals 16 is connected to the primary conductor 10 at an end portion on the opposite side from the first edge in the second direction in planar view. Each primary terminal 16 is formed rectangularly, as an example. The plurality of primary terminals 16 may be a metal such as copper or an alloy containing copper. The plurality of primary terminals 16 includes first primary terminals 16a (a first set of the primary terminals) and second primary terminals 16b (a second set of the primary terminals), and are configured to flow the to-be-measured current from the first primary terminals 16a to the second primary terminals 16b (or from the second primary terminals 16b to the first primary terminals 16a).

The first primary terminals 16a are arranged at one side (upper half in the figure) of a first edge in the third direction in planar view. The second primary terminals 16b are arranged at the other side (lower half in the figure) of the first edge in the third direction in planar view.

Each of the first primary terminals 16a and the second primary terminals 16b may be configured, such that a plane of the second plane 2 side of the current sensor 100 and a plane of the first edge side are exposed flush with the second plane 2 of the package 60 and a plane of the first edge side respectively, with the other planes covered with the package 60. When the current sensor 100 is implemented, for example, on an external substrate, the plane exposed at the second plane 2 side of each primary terminal 16 is bonded, by soldering, to a wiring or the like arranged on an external substrate. Note that the plurality of primary terminals 16 may be plated on the plane on at least second plane 2 side, in order to facilitate bonding to the external substrate by soldering.

The primary dummy terminal 17 may be arranged between the first primary terminals 16a and the second primary terminals 16b on the first edge. The primary dummy terminal 17 is not connected to the primary conductor 10. The primary dummy terminal 17 is provided to improve bonding strength with the outside of the current sensor 100. In addition, the primary dummy terminal 17 is provided to improve self-alignment property during bonding, with the first edge side and a bonding portion with the outside opposite side from the first edge substantially symmetry in the current sensor 100. The primary dummy terminal 17 is contained within the package 60, with a part exposed to the package 60, just like the plurality of primary terminals 16. The primary dummy terminal 17 may have similar material to the plurality of primary terminals 16.

The primary conductor 10 is a conductive member through which a current (which is referred to as a to-be-measured current) flows, which is detected by the current sensor 100. The primary conductor 10 is arranged on the same plane as the primary terminal 16 and is connected to the primary terminal 16, and is configured to flow the to-be-measured current between first primary terminals 16a and the second primary terminals 16b, which are arranged along the first edge of the current sensor 100. The primary conductor has a first region that does not face primary wires 51 and a second region that faces the primary wires 51. The primary conductor 10 may be a non-magnetic metal such as copper or an alloy containing copper. The primary conductor 10 includes: two leg sections 12 including a leg section 12a connected to the first primary terminals 16a and a leg section 12b connected to the second primary terminals 16b; and a bend section 14 between two leg sections 12.

The leg section 12a is arranged along an arranging direction of the first primary terminals 16a (third direction).

The leg section 12a is connected to the plurality of first primary terminals 16a at the end portion on the first edge side of the second direction, in planar view. The leg section 12b is arranged along an arranging direction of the second primary terminals 16b (third direction). The leg section 12b is connected to the plurality of second primary terminals 16b at the end portion on the first edge side of the second direction, in planar view. Each leg section 12 may have a substantially rectangular shape whose longitudinal direction is the third direction in planar view.

The bend section 14 is connected to each leg section 12 at the end portion of the first edge side in the second direction. The bend section 14 passes through between the first magnetic sensor 30 and the signal processing IC 36, and is formed to surround at least a part of the first magnetic sensor 30 in planar view. For example, the bend section 14 is formed in a U-shape in proximity to three edges of the first magnetic sensor 30 in planar view. The bend section 14 may be open toward the first edge side of the second direction. Note that the bend section 14 may be formed integrally with two leg sections 12.

The to-be-measured current is inputted from the first primary terminals 16a (or the second primary terminals 16b), flows through one side of the leg sections 12 in the third direction into the bend section 14, and then is outputted from the second primary terminals 16b (or the first primary terminals 16a) through the other side of the leg sections 12 in the third direction.

The bend section 14 include a first step-formed section 14a (that is, a second region of the primary conductor 10), in which a first step 18a located between the first magnetic sensor 30 and the signal processing IC 36 in planar view is formed, and height of which is smaller than that of other portion (that is, a first region of the primary conductor 10). When there is a plurality of primary wires 51, the first step-formed section 14a (second region) is provided in an area of the primary conductor 10, the first step-formed section 14a facing to all primary wires 51 in the area. Thus, the height of the second region that faces to one of the plurality of primary wires 51 and the height of the second region that faces to the other primary wires 51 may be lower than the height of the first region. Note that when there is one primary wire 51, the first step-formed section 14a (second region) may be formed linearly in an area facing to that primary wire 51, of the primary conductor 10. The first step-formed section 14a may be arranged in a portion, which faces to the primary wire(s) 51, in a plane (that is, second plane 2) on the opposite side from the first plane 1 of the current sensor 100 in the bend section 14, so that in that portion the first step 18a may be formed with the first step 18a recessed toward the first plane 1 side relative to the portion (first region) excluding the first step-formed section 14a in the bend section 14. Note that the first step-formed section 14a may be formed such that both ends of the first step-formed section 14a in the third direction in planar view are oblique relative to the first edge. When the first magnetic sensor 30 and the signal processing IC 36 are connected by the primary wires 51 (which are described below), the first step-formed section 14a prevents the primary wires 51 from contact the primary conductor 10. The portion excluding the first step-formed section 14a in the bend section 14 may have substantially the same height as that of the two leg sections 12. That is, the portion (first region) excluding the first step-formed section 14a in the primary conductor 10 may be formed such that the height (thickness) of the portion is taller (thicker) than that of the first step-formed section 14a.

Note that the portion (first region) excluding the first step-formed section 14a in the primary conductor 10 is formed such that the portion is lower than the plurality of primary terminals 16. Accordingly, at connecting portions with the primary conductor 10 (that is, opposite side from the first edge in the second direction of each primary terminal 16), the plurality of primary terminals 16 protrudes toward the opposite side from the first plane 1 more than the leg sections 12 of the primary conductor 10, so that a second step 18b is formed. The second step 18b prevents the primary conductor 10 from exposing to the surface of the package 60. This causes an isolation distance (creepage distance) along the second plane 2 between the primary terminal 16 and the secondary terminals 41 of current sensor 100 to enlarge, thereby improving a withstand-voltage characteristic of the current sensor 100. As a result, a downsizing of the current sensor 100 becomes possible. In addition, the primary conductor 10 is not exposed to the surface of the package 60, which prevents solder from spreading to the primary conductor 10 side and adhering there when the second plane 2 of the primary terminals 16 is implemented on an external substrate. This enables enough amount of solder for implementation to be supplied on the second plane 2 of the primary terminal 16.

Here, the height of the second step 18b (that is, height difference between the primary terminals 16 and the first region) may be smaller than the height of the first step 18a (that is, height difference between the first region and the second region). This can prevent the thickness of the thick portion of the primary conductor 10 from decreasing and prevent the resistance of the primary conductor 10 from increasing. In addition, the height of the second step 18b (that is, height difference between the primary terminals 16 and the first region) is 20 μm or more, and the height may be 40% or less of the height of the primary terminals 16 in the first direction. The height of the second step 18b may be from 20 μm to 160 μm, preferably, from 40 μm to 100 μm. This enables the thickness of the thick portion of the primary conductor 10 to be maximized, while maintaining an insulating property from the package surface.

The first magnetic sensor 30 may be a Hall element for outputting, to the signal processing IC 36, a signal corresponding to magnetic flux of a magnetic field generated by a current flowing through the primary conductor 10. As the Hall element, a Hall element or the like using a compound semiconductor chip composed of InAs, GaAs, or the like or a silicon chip can be adopted. In addition, instead of that, the first magnetic sensor 30 may be a Hall IC in which a Hall element and an amplifier circuit are integrated, or may be a magnetoresistive element. The first magnetic sensor 30 may be rectangular in shape.

The first magnetic sensor 30 is connected to the signal processing IC 36 via the primary wires 51. The first magnetic sensor 30 is arranged in a space which is formed inside of the bend section 14 without contacting the bend section 14. That is, the first magnetic sensor 30 is arranged at a location surrounded by the primary conductor 10 in planar view. In the figure, the first magnetic sensor 30 is arranged at the location where at least 3 edges of the first magnetic sensor 30 are surrounded by the bend section 14 of the primary conductor 10 in planar view. This enables the first magnetic sensor 30 to capture more magnetic flux generated by a current flowing through the primary conductor 10, thereby improving current detection sensitivity. In addition, the first magnetic sensor 30 may be arranged such that any distance with corresponding edges of the bend section 14 is constant in planar view. This enables the magnetic sensor 30 to detect much more magnetic flux.

The first magnetic sensor 30 has terminals for connecting to each primary wire 51, at four corners of the plane of the second plane 2 side.

In FIG. 1, the height of the first magnetic sensor 30 in the first direction is substantially the same as the height of the first step-formed section 14a of the primary conductor 10, and is smaller than the height of the portion excluding the first step-formed section 14a of the primary conductor 10. Note that the height of the first magnetic sensor 30 in the first direction is not be limited thereto, provided that the height is smaller than the height of the plurality of primary terminals 16. For example, the height of the first magnetic sensor 30 in the first direction may be smaller than the height of the first step-formed section 14a.

Note that the first magnetic sensor 30 may have a magnetic material formed by using magnetic plating or the like on at least one plane of the planes facing each other in the first direction (that is, at least one of planes on the first plane 1 side and the second plane 2 side), to collect magnetic flux. In addition, the first magnetic sensor 30 may be electrostatically shielded by using a non-magnetic conductor, for example, such as copper or aluminum on at least one plane of the planes facing each other in the first direction, to shield electrostatic noise incoming from the outside of the package 60.

The one or more primary wires 51 are linear members formed by using a conductor, for example, such as a metal like copper or gold. The primary wires 51 step over the primary conductor 10 to electrically connect the first magnetic sensor 30 and the signal processing IC 36. The primary wires 51 include a plurality of wires for separately connecting a plurality of terminals of the first magnetic sensor 30 and a plurality of terminal of the signal processing IC 36. For example, the plurality of wires of the primary wires 51 separately connects the plurality of terminals arranged at four corners of the plane on the second plane 2 side in the first magnetic sensor 30 and the plurality of terminals arranged on the first edge side of the plane on the second plane 2 side in the signal processing IC 36. The primary wires 51 may have wires extending parallel to the second direction in planar view, or may have wires extending obliquely relative to the first edge.

The signal processing IC 36 is an element for processing a signal, such as a silicon chip. The signal processing IC 36 is arranged away from the first magnetic sensor 30, on the opposite side from the first magnetic sensor 30 relative to the primary conductor 10 in planar view. The signal processing IC 36 is arranged away from the first magnetic sensor 30, with the primary conductor 10 interposed between the first magnetic sensor 30 and the signal processing IC 36 in the second direction in planar view, and is connected to the first magnetic sensor 30 through the primary wires 51. In addition, the signal processing IC 36 is arranged away from the secondary terminals 41, and is connected to the secondary terminals 41 through the secondary wires 52. The signal processing IC 36 may be rectangular.

The signal processing IC 36 processes a signal received from the first magnetic sensor 30 through the primary wires 51, calculates an amount of current flowing through the primary conductor 10, and outputs the calculated result to the secondary terminals 41 through the secondary wires 52. For example, the signal processing IC 36 has a plurality of terminals on the first edge side and the opposite side from the first edge, on the plane of the second plane 2 side.

The signal processing IC 36 may have an amplifier circuit for amplifying an output signal from the first magnetic sensor 30. In addition, the signal processing IC 36 may have correction circuits, such as a sensitivity correction circuit, an offset correction circuit for correcting an offset of the output signal, a temperature correction circuit for correcting the output signal in response to temperature, and the like. Note that such correction circuits may include correction parameters such as a correction factor.

The plurality of secondary terminals 41 is conductive terminals for supplying a power source for driving the signal processing IC 36, and outputting, to an external device, the calculated result of the amount of current outputted from the signal processing IC 36. The plurality of secondary terminals 41 may be also conductive terminals for inputting, from the external device to the signal processing IC 36, a signal for setting a correction parameter. The plurality of secondary terminals 41 is arranged side by side at fixed intervals in the third direction, along the edge on the opposite side from the first edge of the current sensor 100. Each secondary terminal 41 is arranged on the same plane as the primary terminal 16, and connected to the signal processing IC 36 through the secondary wire 52. Each secondary terminal 41 is formed rectangularly in planar view, as an example.

Each secondary terminal 41 includes a third region, the height of which is higher than that of the signal processing IC 36, has a third step 48 that is down to the first plane 1 side, at the portion, to which the secondary wire 52 is connected, in predetermined range from the end portion of the first edge side in the second direction, and includes a third step-formed section 41a (that is, a fourth region of the secondary terminal 41), the height of which is smaller than that of other portion (third region). The third step-formed section 41a may have substantially the same height as the signal processing IC 36. The third step-formed section 41a recesses toward the first plane 1 side in the plane of the second plane 2 side of the current sensor 100 in the secondary terminal 41. This enables the signal processing IC 36 and each secondary terminal 41 to be easily connected by the secondary wire 52. In addition, the third step-formed section 41a enlarges a creepage distance between the primary terminal 16 and the secondary terminal 41, thereby improving a withstand-voltage characteristic of the current sensor 100. Here, the height of the third step 48 (height difference between the third region and the fourth region) in the first direction may be substantially the same as the sum of the first step 18a (height difference between the first region and the second region) and the second step 18b (height difference between the primary terminal 16 and the first region) in the first direction. That is, the height of the third step-formed section 41a in the first direction may be substantially the same as the height of the first step-formed section 14a in the first direction. This enables the first step-formed section 14a and the third step-formed section 41a to be formed by performing a step-forming process once.

In each secondary terminal 41, at least a part of the plane (for example, the portion excluding the third step-formed section 41a) of the second plane 2 side and the plane on the opposite side from the first edge of the planes facing each other in the second direction may be exposed flush with the second plane 2 of the surface of the package 60 and the plane on the opposite side from the first edge of the planes facing each other in the second direction, respectively. The exposed plane of the second plane 2 side of the secondary terminal 41 is bonded to a wiring or the like arranged on an external substrate, when the current sensor 100 is implemented, for example, on the external substrate.

The secondary wires 52 are linear members formed by using a conductor, for example, such as a metal like copper or gold. The secondary wires 52 electrically connect the signal processing IC 36 and the secondary terminals 41. The secondary wires 52 include a plurality of wires, and the plurality of wires separately connects a plurality of terminals arranged on the opposite side from the first edge of the plane of the second plane 2 side in the signal processing IC 36 and the plurality of third step-formed sections 41a.

The package 60 seals and protects each component of the current sensor 100, excluding parts of the plurality of primary terminals 16 and the plurality of secondary terminals 41, such that the current sensor 100 has a leadless structure in which no lead protrudes from a resin molding. Here, the package 60 covers all outer surfaces of the first magnetic sensor 30 and the signal processing IC 36, and contains each of the first magnetic sensor 30 and the signal processing IC 36 inside. Due to that, each of the first magnetic sensor 30 and the signal processing IC 36 is insulated from the primary terminals 16 and the primary conductor 10. Note that the primary terminals 16, the primary conductor 10, or the secondary terminals 41 are directly supported and covered by the package 60. Accordingly, the current sensor 100 can have a high withstand-voltage. In addition, a separate leadframe for supporting the first magnetic sensor 30 and the signal processing IC 36 becomes unnecessary, so that a downsizing of the current sensor 100 becomes possible.

Note that the package 60 may be formed in a cuboid-shape, for example, by mold forming using an insulating resin such as an epoxy.

The package 60 has a first sealing member 61 for sealing the second plane 2 side (that is, top plane side) of the primary conductor 10, the primary terminals 16, the first magnetic sensor 30, the signal processing IC 36, and the secondary terminals 41, and a second sealing member 62 for sealing the first plane 1 side (that is, bottom plane side). The first sealing member 61 and the second sealing member 62 do not expose all outer surfaces of the primary conductor 10 to the outside of the package 60. In addition, all outer surfaces of the first magnetic sensor 30 and the signal processing IC 36 are not exposed to the outside of the package 60. Accordingly, the withstand-voltage characteristic of the current sensor 100 is improved more, thereby facilitating a downsizing and low-profiling of the current sensor 100.

The first sealing member 61 and the second sealing member 62 are preferably the same material, and each of them may be a different material. In addition, at least one of the first sealing member 61 and the second sealing member 62 may be formed of a material including fillers which are an inorganic material In this way, according to this embodiment, the current sensor 100 has the first step 18a near the region facing to the primary wires 51 on the plane of the second plane 2 side of the primary conductor 10, so that the area of the thin portion of the primary conductor 10 can be minimized. This enables an increase of the resistance of the primary conductor 10 to be minimized, while maintaining a space for connecting with the first magnetic sensor 30 and the signal processing IC 36 by wires. Accordingly, heat generation of the primary conductor 10 caused during energization can be reduced. As a result, even if a high-current flows through the current sensor 100, a decrease of current detection accuracy can be reduced.

According to this embodiment, the height of the second step 18b is 20 μm or more and is 40% or less of the height of the primary terminal 16 in the first direction, which enables the thickness of the thick portion of the primary conductor 10 to be maximize, and an increase of the resistance of the primary conductor 10 to be minimized, while maintaining insulating property relative to external noise from the package surface. Accordingly, heat generation of the primary conductor 10 caused during energization can be reduced. As a result, when a high-current flows through the current sensor 100, a decrease of the current detection accuracy can be prevented.

Figure 2:
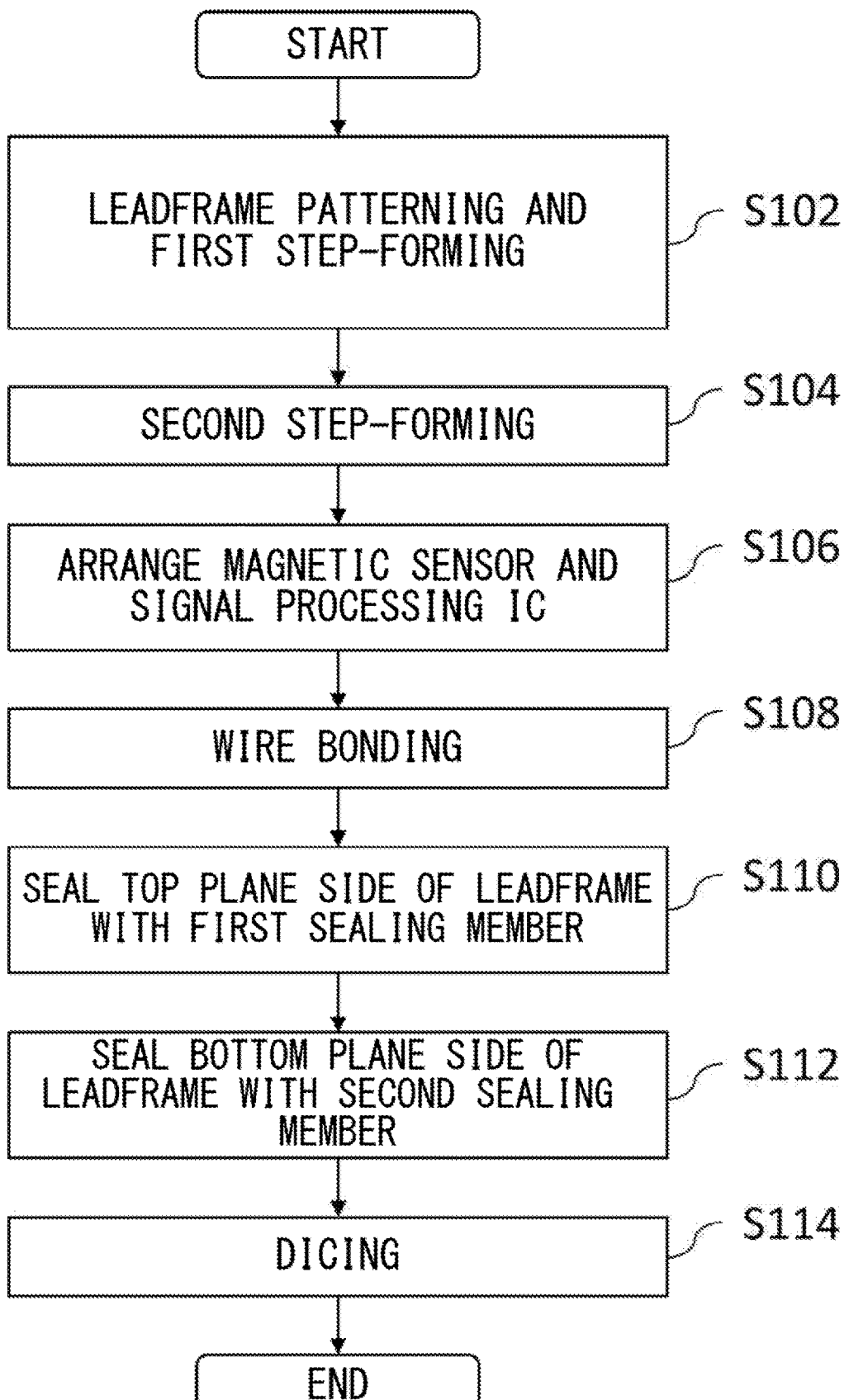
FIG. 2 illustrates a process flow for manufacturing the current sensor according to this embodiment.

The following describes a method for manufacturing a current sensor 100 according to this embodiment. FIG. 2 illustrates a process flow for manufacturing the current sensor 100 according to this embodiment.

Figure 3:
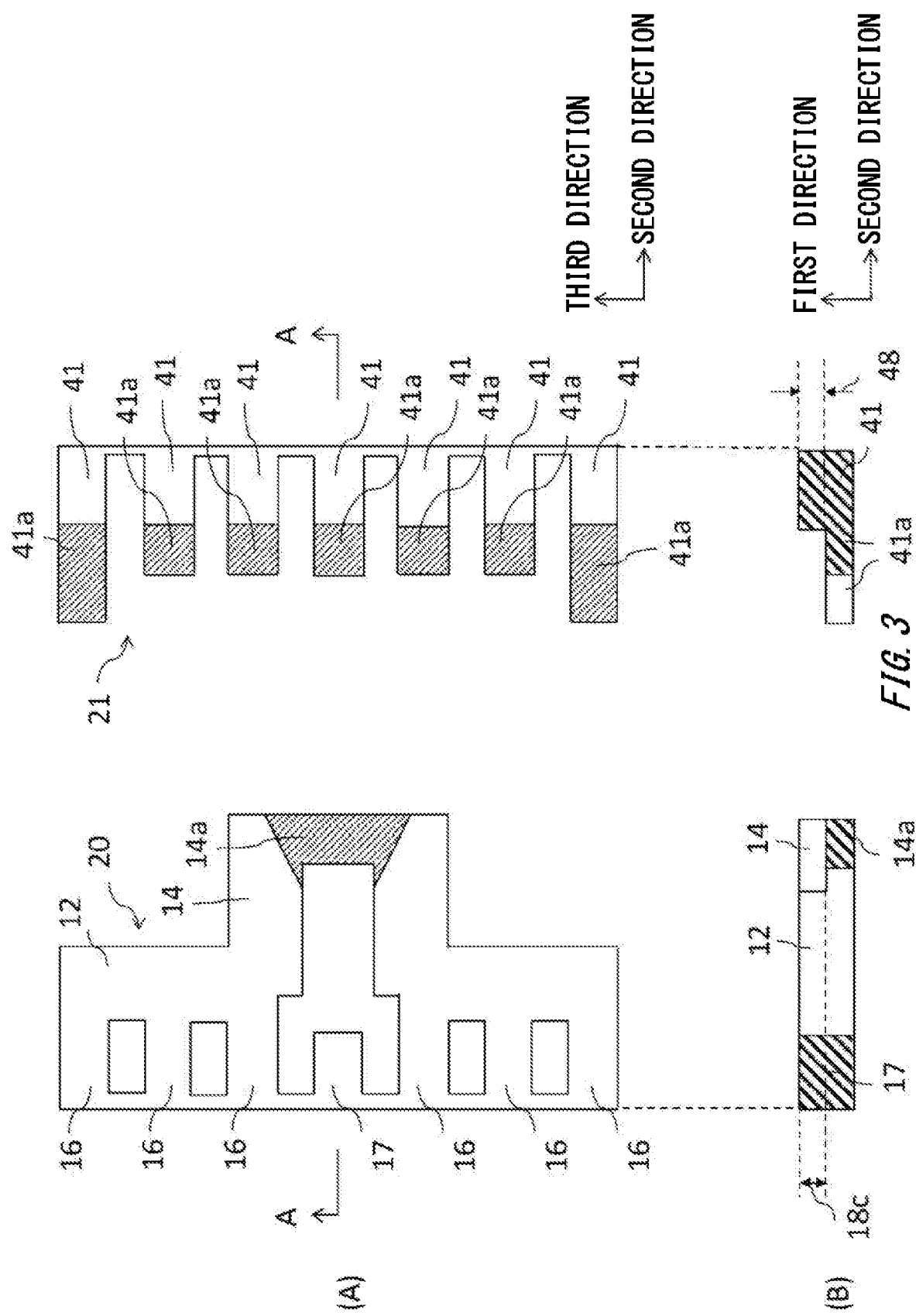
FIG. 3 illustrates a plan view and a schematic sectional view for explaining a process for manufacturing the current sensor.

At S102, patterns for a primary conductor 10, a plurality of primary terminals 16, a primary dummy terminal 17, and a plurality of secondary terminals 41 are formed on leadframes 20, 21, and steps are formed on the leadframes 20, 21 by a first step-forming process. FIG. 3 illustrates a condition after S102 in FIG. 2 is complete. That is, FIG. 3 illustrates the leadframe 20 that includes patterns for the primary conductor 10, the plurality of primary terminals 16 and the primary dummy terminal 17, and on which a first step-formed section 14a is formed, and the leadframe 21 that includes patterns for the plurality of secondary terminals 41, and on which a third step-formed section 41a is formed. A part (A) in FIG. 3 is a plan view, and a part (b) in FIG. 3 is a schematic sectional view along a line A-A in the part (A).

In this embodiment, the leadframe 20 has the primary conductor 10 that includes the plurality of primary terminals 16 and the primary dummy terminal 17 on a first edge side and that includes a leg section 12 and a bend section 14 on the opposite side from the first edge. The plurality of primary terminals 16 and the primary dummy terminal 17 may be integrally connected to each other on the end portion of the first edge side, for example. In this embodiment, the leadframe 21 has a plurality of secondary terminals 41 lined along the edge on the opposite side from the first edge in planar view. Each of the plurality of secondary terminals 41 may be integrally connected to each other at the end portion on the opposite side from the first edge.

In this embodiment, a full-etching is used for forming patterns into the leadframes 20, 21 from a metal plate, and a half-etching is used for forming the step 18c and the third step 48 into the leadframes 20, 21, respectively. The pattern-forming process and the first step-forming process on the leadframes 20, 21 may be performed at the same time. For example, of the planes of the metal plate, both planes of the first plane 1 side and the second plane 2 side, of the plurality of primary terminals 16, the primary dummy terminal 17, the primary conductor 10, and the plurality of secondary terminals 41, are masked. Note that of these planes, the planes on the second plane 2 side of the first step-formed section 14a and the third step-formed section 41a are not masked. By soaking the masked metal plate in etching solution, portions other than the plurality of primary terminals 16, the primary dummy terminal 17, the primary conductor 10, and the plurality of secondary terminals 41 are removed. In addition, the first step-formed section 14a and the third step-formed section 41a are formed at the primary conductor 10 and the plurality of secondary terminals 41, respectively. In this way, the step 18c and the third step 48 are formed at the primary conductor 10 and the plurality of secondary terminals 41, respectively.

The thickness of the metal plate may be, for example, 0.4 mm. The height of the step 18c may be, for example, from 0.2 mm to 0.25 mm. The height of the third step 48 may be, for example, from 0.2 mm to 0.25 mm.

According to this embodiment, by performing the etching process once, the leadframes 20, 21 can be acquired, on which the patterns for the plurality of primary terminals 16, the primary dummy terminal 17, the primary conductor 10 and the plurality of secondary terminals 41 as well as the first step-formed section 14a and the third step-formed section 41a are formed.

In addition, the pattern-forming process and the first step-forming process on the leadframes 20, 21 may be separately performed. For example, after the metal plate is full-etched to form patterns, a part of the metal plate may be half-etched.

Instead of full-etching of the metal plate, by stamping the metal plate, a through-hole may be formed in the metal plate in the first direction, and the patterns for the primary conductor 10, the plurality of primary terminals 16, the primary dummy terminal 17, and the plurality of secondary terminals 41 may be formed. In addition, outer edges of leadframes 20, 21 may be formed by stamping the metal plate, and patterns for the primary conductor 10, the plurality of primary terminals 16, the primary dummy terminal 17, and the plurality of secondary terminals 41 may be formed by etching.

Note that although FIG. 3 illustrates one set of leadframes 20, 21 composing one current sensor 100, that is an example for explaining, and plural sets of leadframes 20, 21 composing a plurality of current sensors 100 may be arranged. At that time, the plural sets of leadframes 20, 21 may be formed, so as to be arranged periodically, and neighboring leadframes 20, 21 composing different current sensors 100 may be coupled each other.

Figure 4:
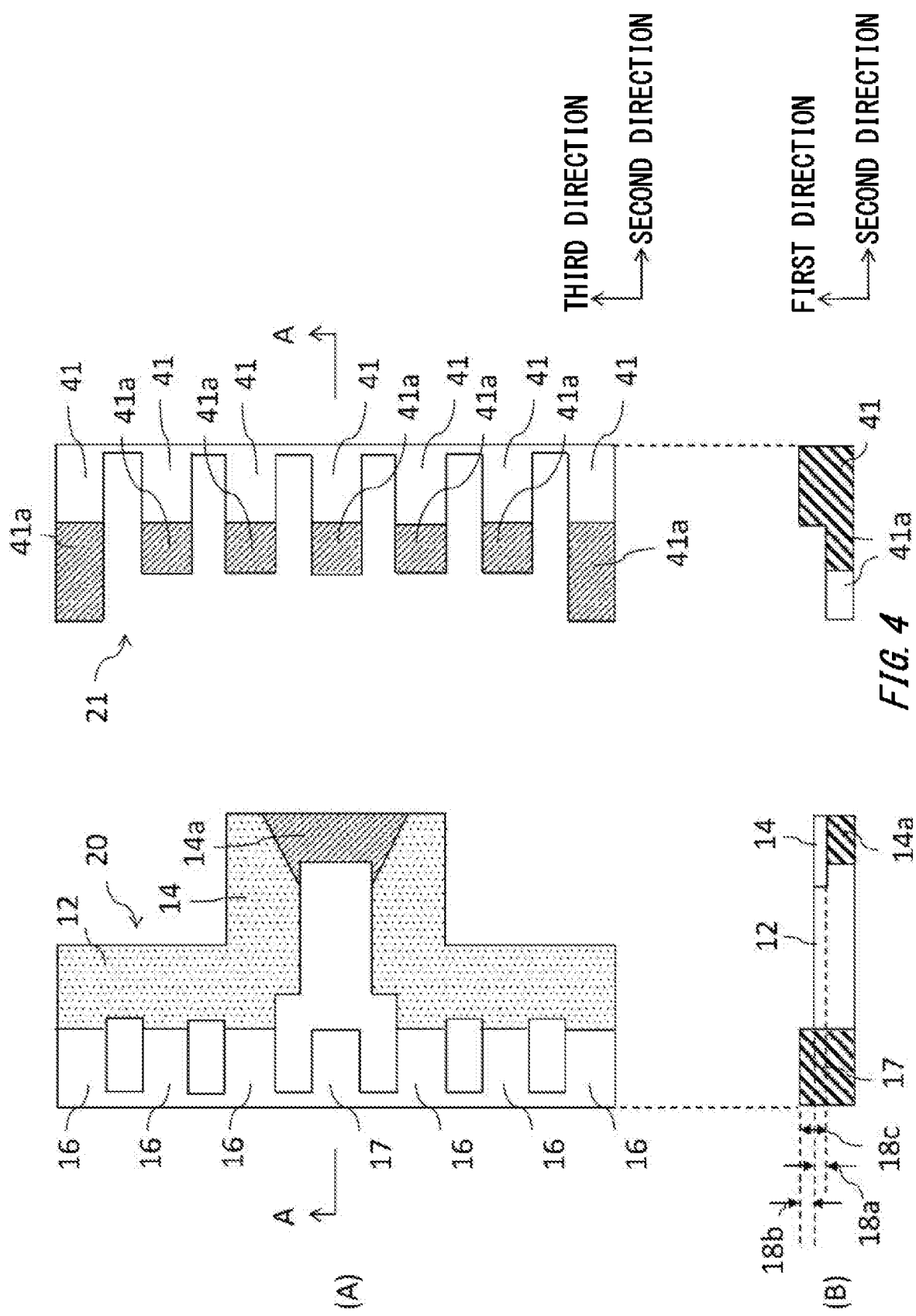
FIG. 4 illustrates a plan view and a schematic sectional view for explaining a process for manufacturing the current sensor.

At S104, a second step 18b is formed between the primary conductor 10 and the primary terminals 16 on the leadframe 20 formed by the second step-forming process at S102. FIG. 4 illustrates a condition after S104 in FIG. 2 is complete, that is, leadframes 20, 21 formed by the second step-forming process. A part (A) in FIG. 4 is a plan view, and a part (B) in FIG. 4 is a schematic sectional view along a line A-A in the part (A).

For example, a portion excluding the first step-formed section 14a in the plane of the primary conductor 10 of the leadframe 20 formed at S102 is etched, thereby thinning that portion. In this way, a second step 18b is formed at each connecting portion between the primary conductor 10 and the plurality of primary terminals 16. This etching forms a first step 18a between the first step-formed section 14a in the primary conductor 10 and the portion excluding the first step-formed section 14a, the first step 18a having a height smaller than a step 18c by the height of a second step 18b.

Note that the second step 18b may be formed by etching or stamping (such as coining) on the plane of the primary conductor 10.

In the leadframe 21, a plated film may be provided on a wire connecting plane of the third step-formed section 41a of the secondary terminal 41, for example, by using silver. Note that after a process for sealing the leadframes 20, 21, and the like with a sealing member at S112, which will be described below, an outer plating film may be provided on a portion, of the leadframes 20, 21, exposed to the surface of the package 60, for example, by using tin or the like.

Figure 5:
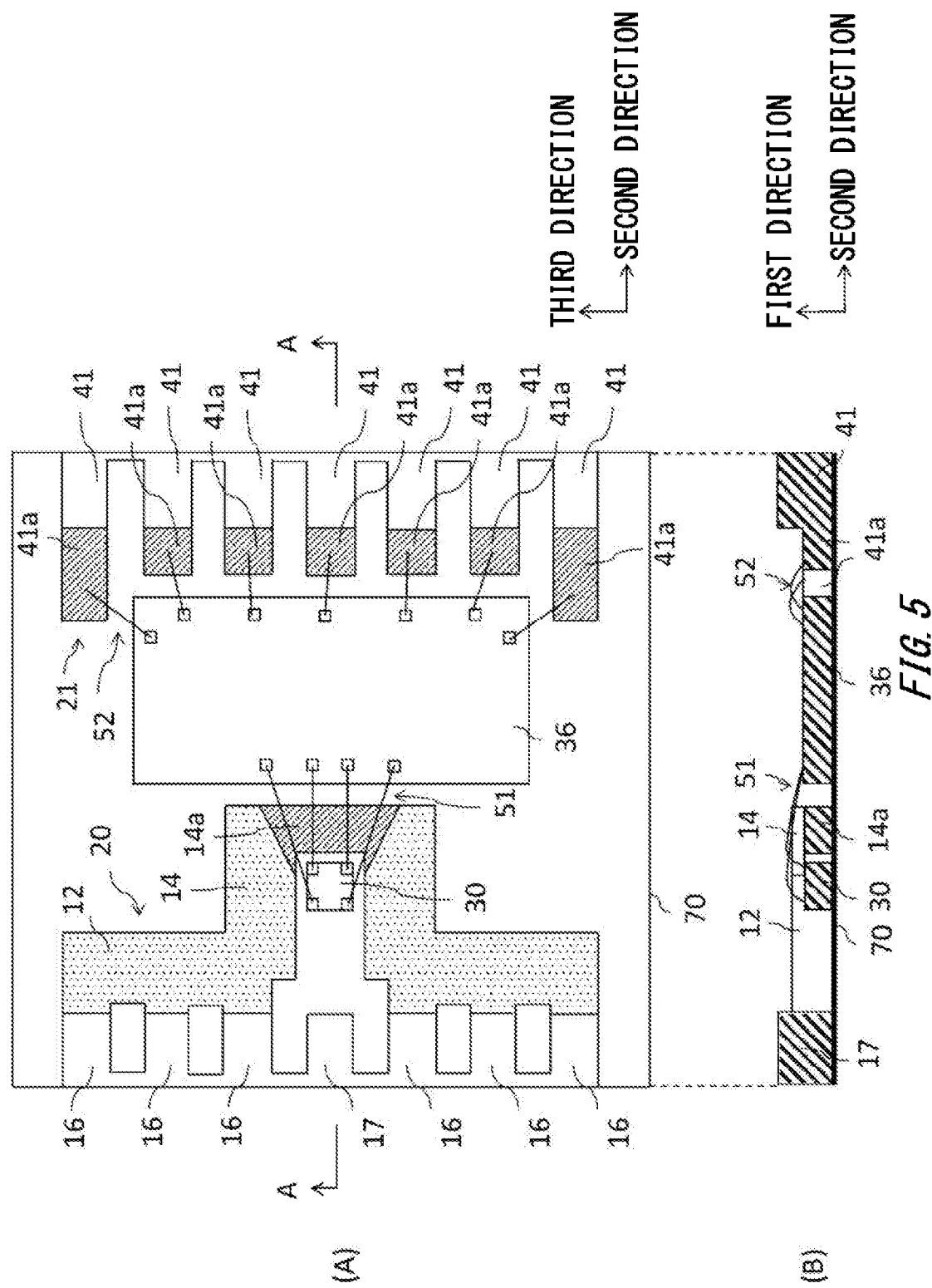
FIG. 5 illustrates a plan view and a schematic sectional view for explaining a process for manufacturing the current sensor.

At S106, a sheet-like supporting member 70 is attached on the planes of the first plane 1 side of the leadframes 20, 21 formed at S104. At S108, a signal processing IC 36, and a first magnetic sensor 30 and secondary terminals 41 are connected by wire bonding. FIG. 5 illustrates a condition after S106 and S108 in FIG. 2 are complete, that is, a condition in which the leadframes 20, 21, the first magnetic sensor 30, and the signal processing IC 36 are arranged spaced apart each other on the supporting member 70, and the signal processing IC 36 is connected to the first magnetic sensor 30 and the secondary terminal 41 with wires. A part (A) in FIG. 5 is a plan view, and a part (B) in FIG. 5 is a schematic sectional view along a line A-A in the part (A).

For example, at S106, the leadframes 20, 21 are arranged on a supporting member 70, such that the bend section 14 of the primary conductor 10 and the end portions of the plurality of secondary terminals 41 face each other. Then, the first magnetic sensor 30 and the signal processing IC 36 are located on the supporting member 70, so as not to contact the leadframes 20, 21. The first magnetic sensor 30 is arranged spaced apart from the bend section 14 in a space formed inside the bend section 14 of the primary conductor 10 on the leadframe 20. Then, the signal processing IC 36 is arranged spaced apart from the primary conductor 10 and the secondary terminals 41 between the primary conductor 10 and the secondary terminals 41 of the leadframe 20 in planar view. As a supporting member 70, for example, a high-thermal-resistance polyimide tape with an adhesion layer formed thereon or the like can be adopted.

For example, at S108, the first magnetic sensor 30 and the signal processing IC 36, which are formed at S106, are connected by the primary wires 51 by using wire bonding. In addition, the signal processing IC 36 and the third step-formed section 41a of each secondary terminal 41 are connected by the secondary wire 52 by using wire bonding.

Figure 6:
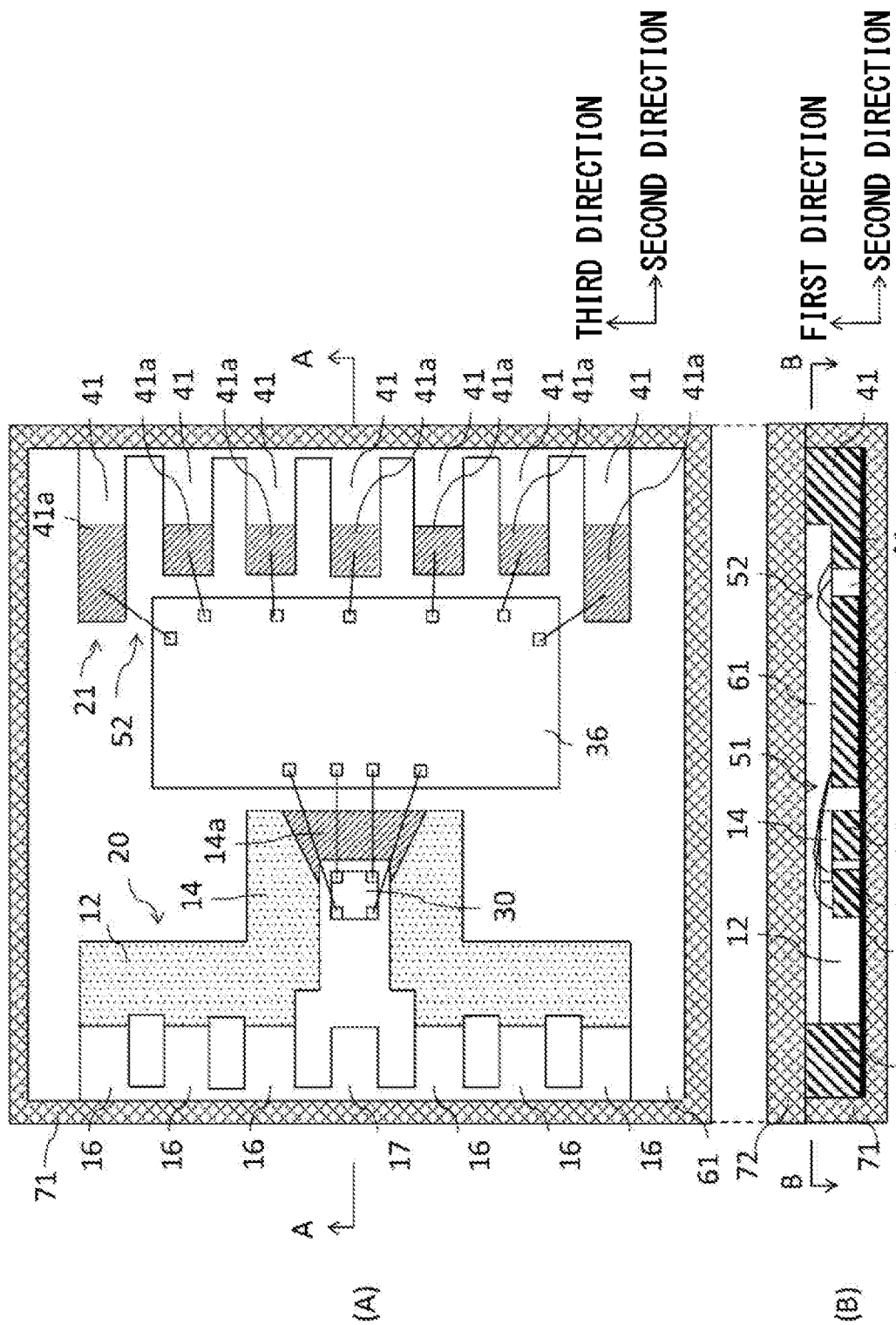
FIG. 6 illustrates a plan view and a schematic sectional view for explaining a process for manufacturing the current sensor.

At S110, the second plane 2 side of the leadframe 20, the leadframe 21, the first magnetic sensor 30, and the signal processing IC 36, which are formed at S108, are sealed by the first sealing member 61. FIG. 6 illustrates a condition after S110 in FIG. 2 is complete, that is, a condition in which the second plane 2 side of the leadframes 20, 21, the first magnetic sensor 30 and the signal processing IC 36 are covered with the first sealing member 61. A part (A) in FIG. 6 is a plan view, and a part (B) in FIG. 6 is a schematic sectional view along a line A-A in the part (A).

For example, the leadframes 20, 21, the first magnetic sensor 30, and the signal processing IC 36 arranged on the supporting member 70 are contained in a box-shaped mold 71 having an opening. Note that when plural sets of leadframes 20, 21, which compose a plurality of current sensors 100, are formed at S102, the plural sets of leadframes 20, 21, the first magnetic sensor 30, and the signal processing IC 36 may be contained in one box-shaped mold 71.

Then, an internal space of the mold 71 are closed with a plate-like lid 72 pressed onto the mold 71, and the first sealing member 61 is cast into the mold 71 through a through-hole (not shown) in the mold 71. Note that the planes on the second plane 2 side of the plurality of primary terminals 16, the primary dummy terminal 17, and the plurality of secondary terminals 41 may contact a plane on the mold 71 side of the lid 72, so as to prevent the first sealing member 61 from flowing to the planes on the second plane 2 side of the terminals. In addition, in order not to prevent resin from soaking into the plane on second plane 2 side of the plurality of primary terminals 16, the primary dummy terminal 17, and the plurality of secondary terminals, for example, the plane of the lid 72 on the mold 71 side may be covered with a thermal-resistance sheet to perform a resin-sealing.

Figure 7:
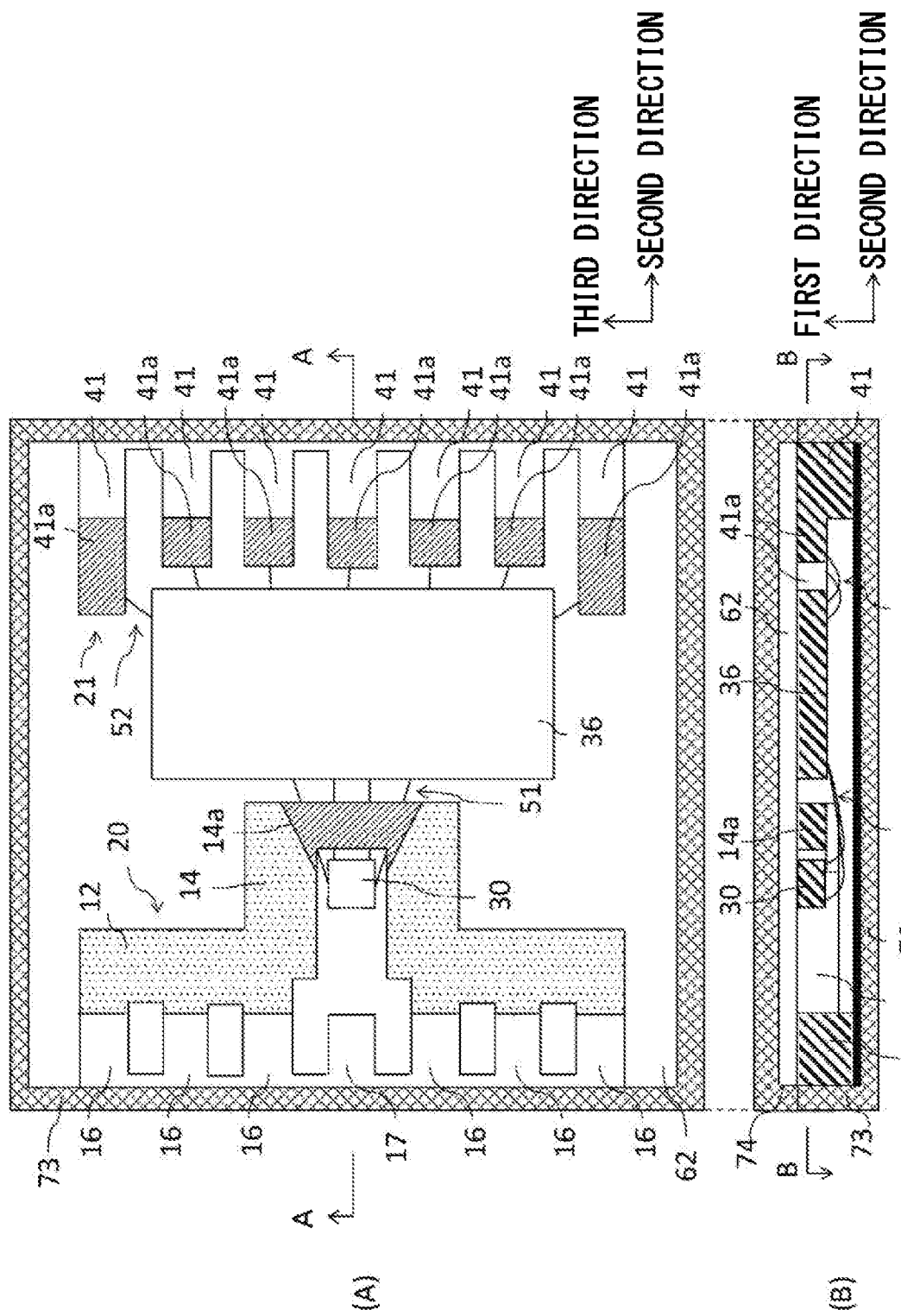
FIG. 7 illustrates a plan view and a schematic sectional view for explaining a process for manufacturing the current sensor.

At S112, the supporting member 70 is removed from the first sealed body formed by S110, which includes the leadframes 20, 21, the first magnetic sensor 30 and the signal processing IC 36, with the second plane 2 side of them sealed. FIG. 7 illustrates a condition after S112 in FIG. 2 is complete, that is, a condition in which the planes on first plane 1 side of both the first magnetic sensor 30 and the signal processing IC 36 are covered with the second sealing member 62. A part (A) in FIG. 7 is a plan view, and a part (B) in FIG. 7 is a schematic sectional view along a line A-A in the part (A).

For example, the first sealed body using the first sealing member 61 is removed from the mold 71, the mold 71 is turned upside down, and the supporting member 70 is removed from the first sealed body. Then, the first plane 1 side, of the leadframe 20, the leadframe 21, the first magnetic sensor 30, and the signal processing IC 36, is sealed by the second sealing member 62. For example, the first sealed body is arranged on the supporting member 70 with the first sealed body keeping on being turned upside down, and is contained in a box-shaped mold 73 having an opening. Note that when the top plane side, of the plural sets of leadframes 20, 21, the first magnetic sensor 30, and the signal processing IC 36 composing the plurality of current sensors 100, is sealed at S110, the sealed body is contained in one box-shaped mold 73.

Then, a box-shaped lid 74 having an opening is pressed onto the mold 73, with the opening of the lid 74 and the opening of the mold 73 facing each other, thereby closing the internal spaces formed by the two openings, and the second sealing member 62 is cast into the internal space through a through-hole (not shown) of the lid 74. Note that the mold 73 may be heated, such that the temperature of resin of the first sealing member 61 reaches the glass-transition temperature or more. This causes resin components at an interface portion of the second sealing member 62 and resin component at an interface portion of the first sealing member 61 to be integrated and cured. In this way, the first magnetic sensor 30, the signal processing IC 36, the primary wires 51, parts of the plurality of primary terminals 16 and the primary dummy terminal 17, and the primary conductor 10 are sealed as a package 60. The first magnetic sensor 30 and the signal processing IC 36 are supported only by resin, with all outer surfaces of them covered with resin. Note that the planes on the second plane 2 side of the plurality of primary terminals 16, the primary dummy terminal 17, and the plurality of secondary terminals 41, are not sealed inside the package 60, and are each exposed flush with the second plane 2 of the package 60.

Figure 8:
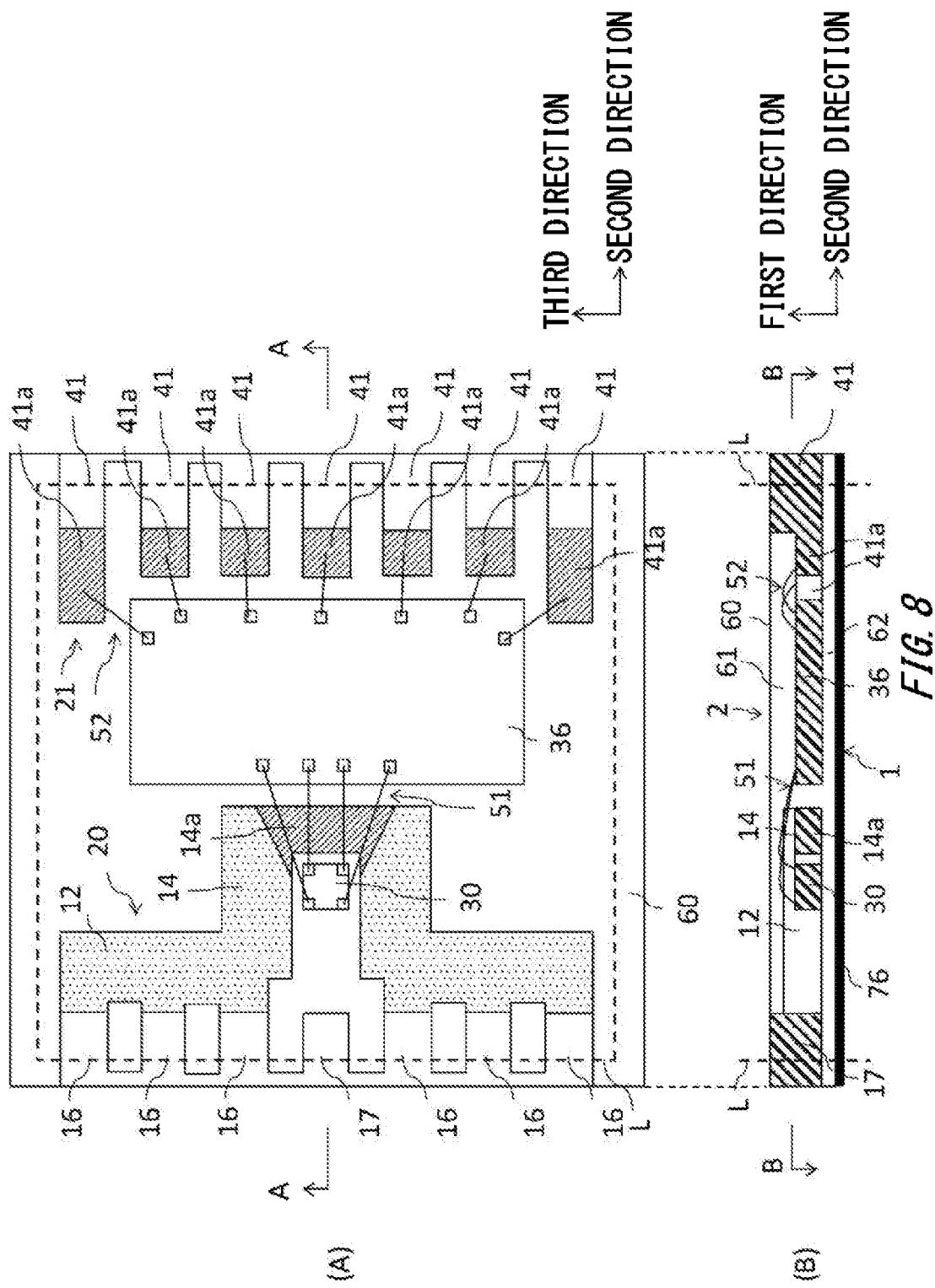
FIG. 8 illustrates a plan view and a schematic sectional view for explaining a process for manufacturing the current sensor.

At S114, the package 60 formed at S112 is diced. FIG. 8 illustrates a condition after S114 in FIG. 2 is complete, that is, a condition in which the leadframes 20, 21, the first magnetic sensor 30 and the signal processing IC 36 are packaged, and arranged on the supporting member 76. A part (A) in FIG. 8 is a plan view, and a part (B) in FIG. 8 is a schematic sectional view along a line A-A in the part (A).

For example, the package 60 formed at S112 is removed from the mold 73, and is arranged on the supporting member 76, with the package 60 turned upside down. Along a cutting line L, in the package 60, portions where each primary terminal 16 and primary dummy terminal 17, of the leadframe 20, couples each other, and portions where each secondary terminal 41 of the leadframe 21 couples each other, are cut together with outer edges of the first sealing member 61 and the second sealing member 62. In this way, the planes on the first edge side of the plurality of primary terminals 16 and the primary dummy terminal 17, and the planes on the opposite side from the first edge of the plurality of secondary terminals 41, are exposed flush with a plane on the first edge side of the package 60 and a plane on the opposite side from the first edge, respectively. Finally, the current sensor 100 is complete.

According to the method for manufacturing the current sensor 100 according to this embodiment, the first step 18a and the second step 18b are formed by slightly etching or coining, in the second step-forming process, portions excluding portions etched in the first step-forming process. This enables the current sensor 100 to be efficiently manufactured in short processing time, while maintaining a space for connecting wires, reducing a decrease in thickness of the primary conductor 10, and preventing an increase in resistance of the primary conductor 10.

According to the method for manufacturing the current sensor 100 according to this embodiment, after the second plane 2 side, of the leadframes 20, 21, the first magnetic sensor 30, and the signal processing IC 36, is sealed by the first sealing member 61, the first plane 1 side, which is turned upside down, is sealed by the second sealing member 62. This enables the package 60 to be formed, with the first sealing member 61 and second sealing member 62 integrated. Accordingly, the current sensor 100 having a high withstand-voltage characteristic can be manufactured.

Note that in this embodiment, the first magnetic sensor 30 and the signal processing IC 36 are illustrated in the form of not being supported by a leadframe or the like, but the first magnetic sensor 30 and the signal processing IC 36 may be placed on a leadframe, for example.

In addition, the current sensor 100 may not have the primary dummy terminal 17.

Figure 9:
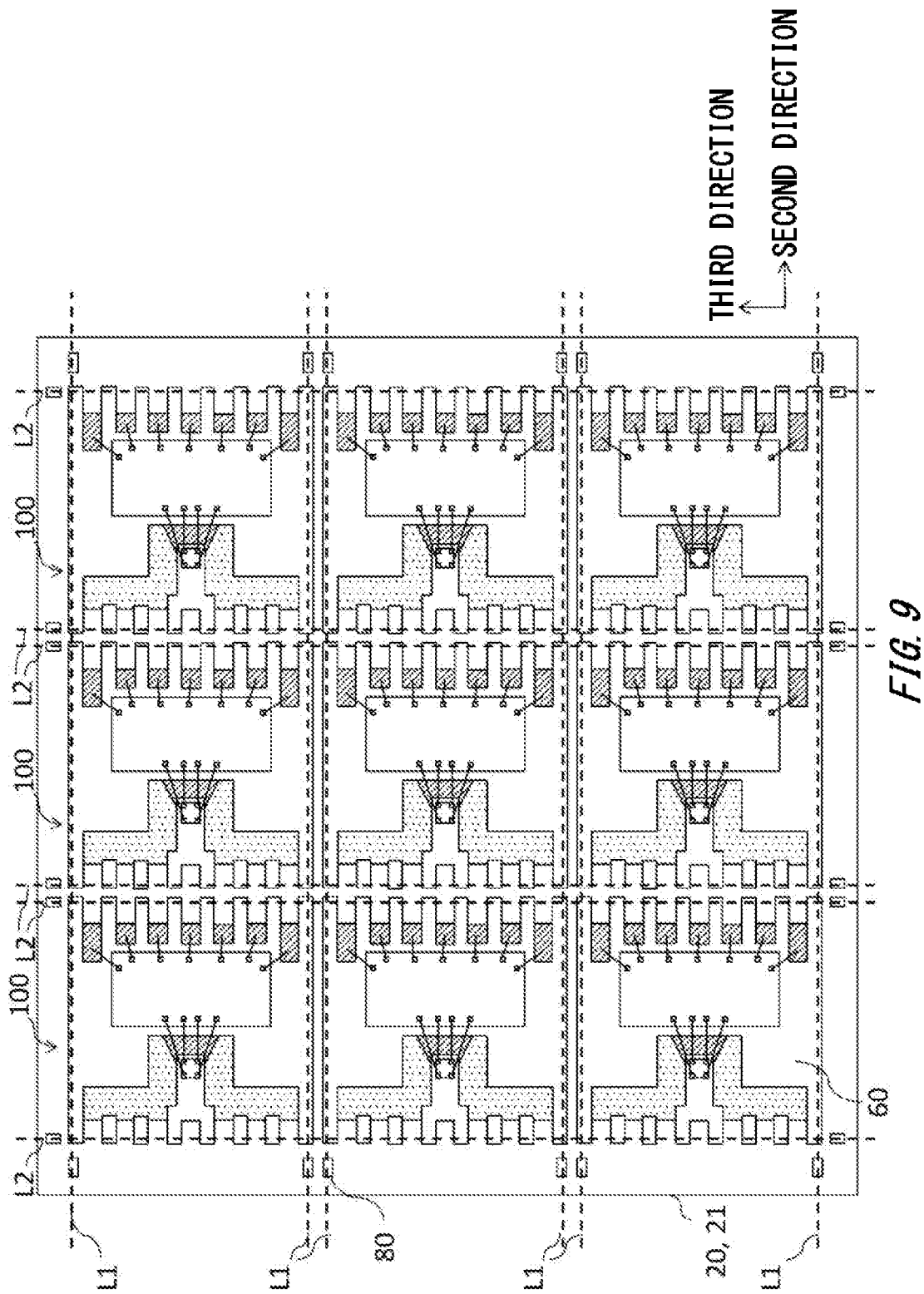
FIG. 9 illustrates how dicing is performed on a package composed of a plurality of current sensors.

FIG. 9 illustrates a condition in which packages 60 composing a plurality of current sensors 100 are to be diced. That is, FIG. 9 illustrates a plan view of an internal structure of the packages 60 and cutting lines L1, L2, when plural sets of the leadframes 20, 21, the first magnetic sensors 30, and the signal processing ICs 36, composing a plurality of current sensors 100, are formed and resin-sealed. In the figure, the leadframes 20, 21 for a plurality of current sensors 100 are formed from a single metal plate (entire leadframe). The leadframes 20, 21 are arranged side by side in plural sets in the second direction and the third direction, respectively. Neighboring leadframes 20, 21 are coupled each other via their end portions.

The plural sets of leadframes 20, 21 coupled each other are formed from a single metal plate by processes similar to the processes shown in S102 to S104 in FIG. 2. The package 60 is formed by processes similar to the processes shown in S106 to S112, by using the plural sets of leadframes 20, 21. At S114, the package 60 formed at S112 is removed from the mold 73, and arranged on the supporting member 76, with the package 60 turned upside down. Then, along the cutting lines L1, L2, the packages 60 are separately cut in the second direction and the third direction. Note that alignment marks 80 may be formed on the leadframes 20, 21 in advance, and the packages 60 may be cut according to the alignment marks 80. Finally, individual current sensor 100 is complete.

In this way, by arranging the leadframes 20, 21 in plural sets, the patterning process and the step-forming process can be collectively performed in a unit of plural sets. In addition, by using this configuration, a plurality of current sensors 100 can be collectively separated. Accordingly, mass production of the current sensors 100 is facilitated.

Figure 10:
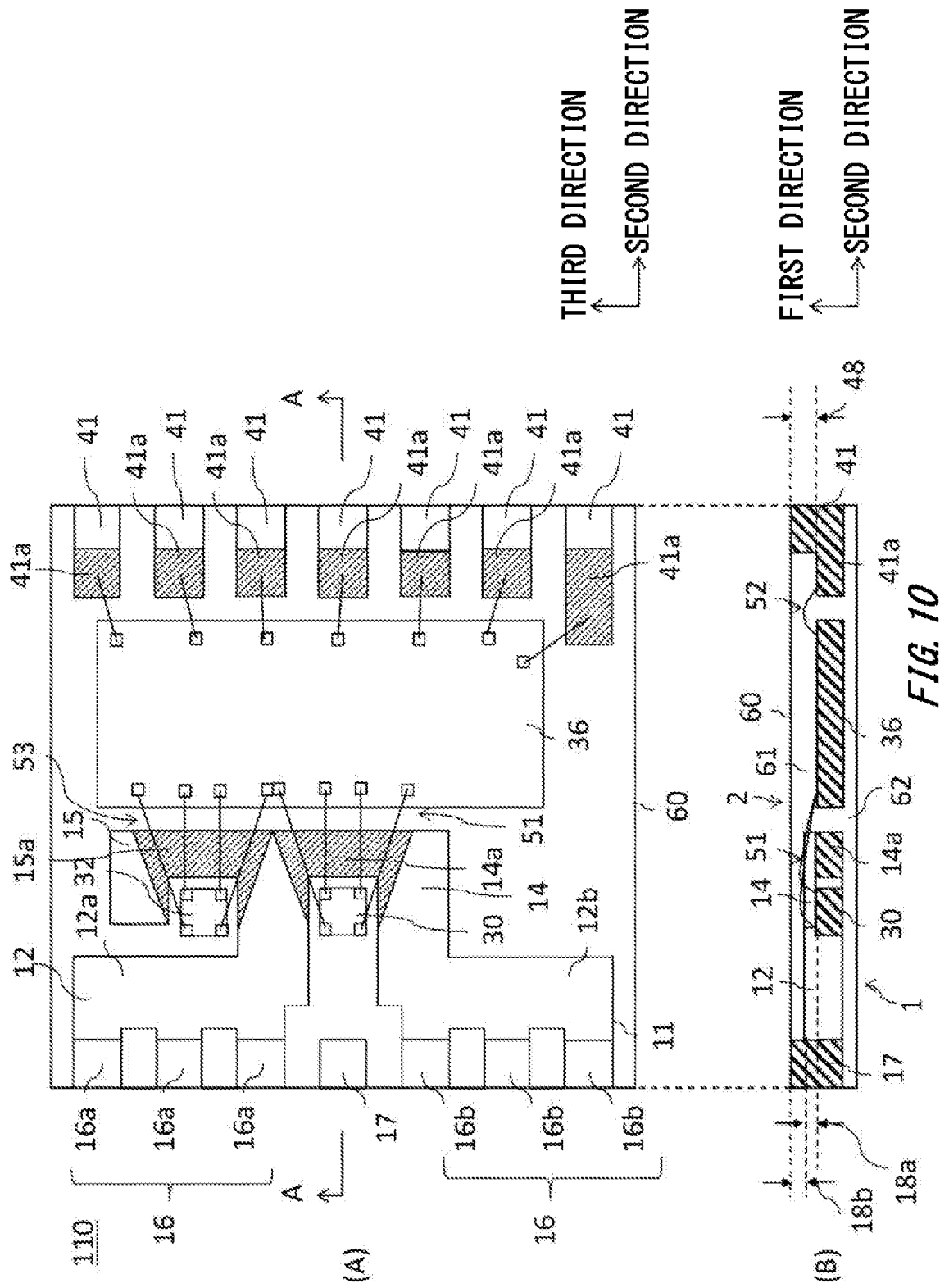
FIG. 10 illustrates a plan view and a schematic sectional view of an internal structure of the current sensor according to a first example variation of this embodiment.

FIG. 10 illustrates an internal structure of a current sensor 110 according to a first example variation of this embodiment. A part (A) in FIG. 10 is a plan view of the current sensor 110, and a part (B) in FIG. 10 is a schematic sectional view of the current sensor 110 along a line A-A in the part (A). The current sensor 110 shown in FIG. 10 has almost similar configuration and functions to the current sensor 100 shown in FIG. 1, and different points from the current sensor 100 are not to have the primary conductor 10 and have a primary conductor 11, a second magnetic sensor 32, and primary wires 53. Note that components in the figure indicated by the same reference numerals as in FIG. 1 are basically similar to those illustrated in FIG. 1 to FIG. 9, therefore description is not repeated herein.

The primary conductor 11 has similar configuration and functions to the primary conductor 10 in FIG. 1, but has a different shape, a different point of which are to have an extended section 15 including a first step-formed section 15a.

The extended section 15 is extended from the bend section 14 in the third direction to be formed. The extended section 15 is formed to surround at least a part of the second magnetic sensor 32 in planar view. For example, the extended section 15 formed in an L-shape in proximity to two edges of the second magnetic sensor 32 in planar view. Note that the extended section 15 is not connected to a leg section 12 at an end portion and arranged spaced apart from a leg section 12. Accordingly, no to-be-measured current flows through the extended section 15. The extended section 15 passes through between the second magnetic sensor 32 and a signal processing IC 36. The extended section 15 together with the leg section 12 and the bend section 14 may have an opening which is partially open toward the third direction. Note that the extended section 15 may be formed integrally with the bend section 14.

The first step-formed section 15a in the extended section 15 is located between the second magnetic sensor 32 and the signal processing IC 36 in planar view. The first step-formed section 15a may be particularly arranged at a portion facing the primary wires 53 in a plane on the second plane 2 side in the primary conductor 11. The first step-formed section 15a forms a first step 18a which is recessed toward the first plane 1 side relative to a portion excluding two of first step-formed section 14a and first step-formed section 15a in the primary conductor 11. The first step-formed section 15a may be formed such that both ends of the first step-formed section 15a in the third direction in planar view are oblique relative to the first edge. When the second magnetic sensor 32 and the signal processing IC 36 are connected by the primary wires 53, the first step-formed section 15a prevents the primary wires 53 from contact the primary conductor 11. The first step-formed section 15a may have similar configuration to the first step-formed section 14a. Note that the first step-formed section 15a may be formed with the first step-formed section 14a, by using a step-forming process such as etching.

The second magnetic sensor 32 may be a similar element to the first magnetic sensor 30. The second magnetic sensor 32 is arranged outside of a region surrounded by the primary conductor 11, the primary terminals 16, and the first edge in planar view. The second magnetic sensor 32 is arranged away from the extended section 15 in a region surrounded by the extended section 15. Because of no current flowing through the extended section 15, by obtaining a difference between an output of the first magnetic sensor 30 and an output of the second magnetic sensor 32, external magnetic-field noise applied to the current sensor 110 from the outside can be removed. In addition, as heat generated by a current flowing through the bend section 14 of the primary conductor 11 transfers to the extended section 15, the second magnetic sensor 32 is placed under temperature environment close to the first magnetic sensor 30, so that a temperature correction process computed by the signal processing IC 36 becomes easy.

In FIG. 10, the second magnetic sensor 32 may have substantially the same height as the first magnetic sensor 30 in the first direction.

The primary wires 53 are linear members formed by using a conductor, for example, such as a metal like copper or gold. The primary wires 53 electrically connect the second magnetic sensor 32 and the signal processing IC 36. The primary wires 53 include a plurality of wires for separately connecting each terminal of the second magnetic sensor 32 and each terminal of the signal processing IC 36. For example, the plurality of wires of the primary wires 53 separately connects the plurality of terminals arranged at four corners of the plane on the second plane 2 side in the second magnetic sensor 32 and the plurality of terminals arranged on the first edge side of the plane on the second plane 2 side in the signal processing IC 36. The primary wires 53 may have wires extending parallel to the second direction in planar view, or may have wires extending obliquely relative to the first edge.

According to the first example variation of this embodiment, the current sensor 110 can cancel noise such as an external magnetic-field or the like generated around the primary conductor 11, because of having the extended section 15 and the second magnetic sensor 32.

According to the first example variation of this embodiment, the primary conductor 11 has the extended section 15, so that a part of heat generated in the primary conductor 11 during energization is transferred to the extended section 15. As a result, heat dissipation of the current sensor 110 is improved.

While the present invention has been described by using embodiments, the technical scope of the invention is not limited to the above-described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, stages, and the like of each process performed by an apparatus, system, program, and method shown in the claims, specification, or drawings can be performed in any order as long as the order is not indicated by "prior to," "before," or the like and as long as the output from a previous process is not used in a later process. Even if the operational flow is conveniently described using phrases such as "first" or "next" in the claims, specification, or drawings, it does not necessarily mean that the process must be performed in this order.

What is claimed is:

1. A current sensor comprising:
primary terminals;
a first magnetic sensor;
a primary conductor that is arranged on the same plane as the primary terminals and that is connected to the primary terminals;
a signal processing IC that is arranged on the opposite side from the first magnetic sensor relative to the primary conductor, away from the first magnetic sensor, in planar view; and
a wire for connecting the first magnetic sensor and the signal processing IC, stepping over the primary conductor; wherein the primary conductor has a first region that does not face the wire and a second region that faces the wire;

the second region is thinner than the first region such that a step, in which a height of the second region is lower than a height of the first region, is formed in the primary conductor, and the wire passes over the step formed in the primary conductor.

2. The current sensor according to claim 1, comprising:
a plurality of the wires; wherein
the height of the second region that faces one of the plurality of wires and the height of the second region that faces other wires is lower than that of the first region.

3. The current sensor according to claim 1, wherein the first magnetic sensor, the signal processing IC, the wire, a part of the primary terminals, and the primary conductor are sealed in a package.

4. The current sensor according to claim 3, wherein the first magnetic sensor and the signal processing IC are not exposed to the outside of the package.

5. The current sensor according to claim 3, wherein the primary conductor is not exposed to the outside of the package.

6. The current sensor according to claim 3, wherein the first magnetic sensor is a Hall element.

7. The current sensor according to claim 6, wherein
the Hall element is a compound semiconductor chip; and
the signal processing IC is a silicon chip.

8. The current sensor according to claim 3, wherein the package have a leadless structure with no lead protruding from a resin molding.

9. The current sensor according to claim 1, wherein a height difference between the primary terminals and the first region is smaller than a height difference between the first region and the second region.

10. The current sensor according to claim 1, wherein a height difference between primary terminals and the first region is 20 μm or more and is 40% or less of a height of the primary terminals.

11. The current sensor according to claim 1, further comprising:
a secondary terminal that is connected to the signal processing IC via a secondary wire and that is arranged on the plane, wherein
the secondary terminal comprises a third region whose height is higher than a height of the signal processing IC.

12. The current sensor according to claim 11, wherein
a fourth region, in the secondary terminal, to which the secondary wire is connected is lower than the third region; and
a height difference between the third region and the fourth region is substantially the same as a sum of a height difference between the first region and the second region and a height difference between the primary terminal and the first region.

13. The current sensor according to claim 11, wherein the signal processing IC is arranged between the primary conductor and the secondary terminal, in the planar view.

14. The current sensor according to claim 1, wherein
the primary conductor is configured to flow a to-be-measured current between a first set of the primary terminals that is connected to one end of the primary conductor and a second set of the primary terminals that is connected to the other end of the primary conductor, the first and second set of the primary terminals being arranged along a first edge of the current sensor; and
the first magnetic sensor is arranged at a location surrounded by the primary conductor, in the planar view.

15. The current sensor according to claim 14, further comprising:
a second magnetic sensor that is arranged outside of a region surrounded by the primary conductor and the first edge, in the planar view.

16. The current sensor according to claim 1, wherein the signal processing IC is supported only by a resin.

17. A method for manufacturing the current sensor according to claim 1, the method comprising:
forming, on a plane of a primary conductor, a height difference between a first region and a second region by etching, and forming a height difference between primary terminals and the first region by etching or coining.

18. The current sensor according to claim 1, wherein the second region is provided between the first magnetic sensor and the signal processing IC.

19. The current sensor according to claim 1, wherein a height of the wire that passes over the step is above the height of the second region and below a height of the primary terminals.

* * * * *